(12) United States Patent
Cai et al.

(10) Patent No.: US 11,303,267 B2
(45) Date of Patent: Apr. 12, 2022

(54) FLIP-FLOP

(71) Applicants: Semiconductor Manufacturing International (Shanghai) Corporation, Shanghai (CN); Semiconductor Manufacturing International (Beijing) Corporation, Beijing (CN)

(72) Inventors: Yan Fei Cai, Shanghai (CN); Kai Hua Hou, Shanghai (CN); Yuan Chai, Shanghai (CN); Jian Chen, Shanghai (CN); Jun Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/017,139

(22) Filed: Sep. 10, 2020

(65) Prior Publication Data

US 2021/0075407 A1 Mar. 11, 2021

(30) Foreign Application Priority Data

Sep. 11, 2019 (CN) .......................... 201910860013.9

(51) Int. Cl.
*H03K 3/037* (2006.01)
*H03K 3/012* (2006.01)
*H03K 3/3562* (2006.01)

(52) U.S. Cl.
CPC ........... *H03K 3/0372* (2013.01); *H03K 3/012* (2013.01); *H03K 3/3562* (2013.01)

(58) Field of Classification Search
CPC .... H03K 3/012; H03K 3/0372; H03K 3/3562; H03K 3/35625
See application file for complete search history.

(56) References Cited

U.S. PATENT DOCUMENTS

| 5,999,030 | A * | 12/1999 | Inoue | H03K 3/0372 |
| | | | | 327/202 |
| 6,242,957 | B1 * | 6/2001 | Uemura | H03K 3/35625 |
| | | | | 327/202 |
| 7,408,393 | B1 * | 8/2008 | Jain | H03K 3/0372 |
| | | | | 327/202 |
| 7,843,218 | B1 * | 11/2010 | Ramaraju | G01R 31/318541 |
| | | | | 326/46 |
| 8,502,561 | B2 * | 8/2013 | Howard | H03K 5/1534 |
| | | | | 326/93 |
| 8,536,918 | B2 * | 9/2013 | Nishioka | G01R 31/318594 |
| | | | | 327/203 |
| 9,130,550 | B2 * | 9/2015 | Kim | H03K 3/0375 |

* cited by examiner

*Primary Examiner* — Patrick O Neill
(74) *Attorney, Agent, or Firm* — Anova Law Group, PLLC

(57) ABSTRACT

A flip-flop is provided. The flip-flop includes: a first inverter including an input terminal to receive data signal and an output terminal coupled to an input terminal of the master latch, a second inverter, a master latch including an output terminal coupled to an input terminal of a slave latch, and the slave latch including an output terminal coupled to an input terminal of the second inverter. An output terminal of the second inverter is configured as an output terminal of the flip-flop. A duration of the first clock signal inputted to the master latch is greater than a duration of the first clock signal inputted to the slave latch. A duration of the second clock signal inputted to the master latch is greater than a duration of the second clock signal inputted to the slave latch.

10 Claims, 2 Drawing Sheets

FLIP-FLOP

CROSS-REFERENCE TO RELATED APPLICATION

This application claims the priority of Chinese Patent Application No. 201910860013.9, filed on Sep. 11, 2019, the content of which is incorporated herein by reference in its entirety.

TECHNICAL FIELD

The present disclosure generally relates to the field of circuits, and, more particularly, relates to a flip-flop.

BACKGROUND

Flip-flops are key part for implementing timing functions. Optimizing performance of the flip-flops can improve a response speed of the flip-flops, thereby further improving a computing performance of a critical path and even an overall circuit.

In existing technologies, a solution for optimizing the performance of the flip-flops usually includes increasing sizes of components to improve driving capability, and thus to improve the response speed of the flip-flops. Another solution for optimizing the performance of the flip-flops includes circuit structure changes and use of soft-edge flip-flops.

However, all solutions for optimizing the performance of the flip-flops in the existing technologies need to sacrifice additional power consumption and area.

SUMMARY

One aspect of the present disclosure provides flip-flop. The flip-flop includes: a first inverter, a second inverter, a master latch, and a slave latch. The first inverter includes an input terminal configured to receive data signal, and an output terminal coupled to an input terminal of the master latch. An output terminal of the master latch is coupled to an input terminal of the slave latch. An output terminal of the slave latch is coupled to an input terminal of the second inverter. Each of the master latch and the slave latch includes two clock signal input terminals for inputting first clock signal and second clock signal respectively. An output terminal of the second inverter is configured as an output terminal of the flip-flop. A duration of the first clock signal inputted to the first clock signal input terminal of the master latch is greater than a duration of the first clock signal inputted to the first clock signal input terminal of the slave latch. A duration of the second clock signal inputted to the second clock signal input terminal of the master latch is greater than a duration of the second clock signal inputted to the second clock signal input terminal of the slave latch.

Optionally, in the flip-flop, the master latch includes a first transmission gate, a first tri-state gate, and a third inverter. The first transmission gate includes an input terminal coupled to the output terminal of the first inverter, and an output terminal coupled to an input terminal of the third inverter and an output terminal of the first tri-state gate. The third inverter includes an output terminal coupled to an input terminal of the first tri-state gate and the input terminal of the slave latch.

Optionally, a portion of devices in a data transmission path of the flip-flop includes first-type transistors, and a remaining portion of the devices in the data transmission path of the flip-flop includes second-type transistors. A channel length in the first-type transistors is less than a channel length in the second-type transistors.

Optionally, a portion of devices of the slave latch in the data transmission path of the flip-flop includes the first-type transistors, and a remaining portion of the devices of the slave latch includes the first-type transistors or the second-type transistors.

Optionally, the slave latch includes a second transmission gate, a second tri-state gate, and a fourth inverter. The second transmission gate includes an input terminal coupled to the output terminal of the master latch, and an output terminal coupled to an input terminal of the fourth inverter, an output terminal of the second tri-state gate, and the input terminal of the second inverter. The second transmission gate is disposed in the data transmission path of the flip-flop. An output terminal of the fourth inverter is coupled to an input terminal of the second tri-state gate.

Optionally, devices closest to the output terminal of the flip-flop include the first-type transistors.

Optionally, the second inverter includes the first-type transistors.

Optionally, the flip-flop further includes a clock signal generation circuit. The clock signal generation circuit includes a fifth inverter and a sixth inverter. The fifth inverter includes an input terminal configured to input original clock signal, and an output terminal coupled to an input terminal of the sixth inverter, for outputting the first clock signal. The sixth inverter includes the input terminal configured to input the first clock signal, and an output terminal configured to output the second clock signal.

Optionally, each of the fifth inverter and the sixth inverter includes the first-type transistors.

Optionally, the channel length in the first-type transistor is about 14 nm to about 19 nm, and the channel length in the second-type transistors is about 20 nm to about 25 nm.

Other aspects or embodiments of the present disclosure can be understood by those skilled in the art in light of the description, the claims, and the drawings of the present disclosure.

In the present disclosure, a duration of a first clock signal input to a first clock signal input terminal of a master latch may be greater than a duration of a first clock signal input to a first clock signal input terminal of a slave latch. A duration of a second clock signal input to a second clock signal input terminal of the master latch may be greater than a duration of a second clock signal input to a second clock signal input terminal of a slave latch. Therefore, when clock signal input is received, the opening speed of the slave latch may be faster than an opening speed of the master latch. A settling time of the flip-flop may be reduced and a circuit response speed of the flip-flop may be improved, without the need for additional adjustments on the circuit structure. Optimization of the flip-flop may be simplified.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The present disclosure provides a flip-flop. For example, a duration of a first clock signal input to a first clock signal input terminal of a master latch may be greater than a duration of a first clock signal input to a first clock signal input terminal of a slave latch. A duration of a second clock signal input to a second clock signal input terminal of the master latch may be greater than a duration of a second clock signal input to a second clock signal input terminal of a slave latch. Therefore, when clock signal input is received, the opening speed of the slave latch may be faster than an opening speed of the master latch. A settling time of the flip-flop may be reduced and a circuit response speed of the flip-flop may be improved, without the need for additional adjustments on the circuit structure. Optimization of the flip-flop may be simplified.

Reference will now be made in detail to exemplary embodiments of the disclosure, which are illustrated in the accompanying drawings. Wherever possible, the same reference numbers will be used throughout the drawings to refer to the same or like parts.

Figure 1:
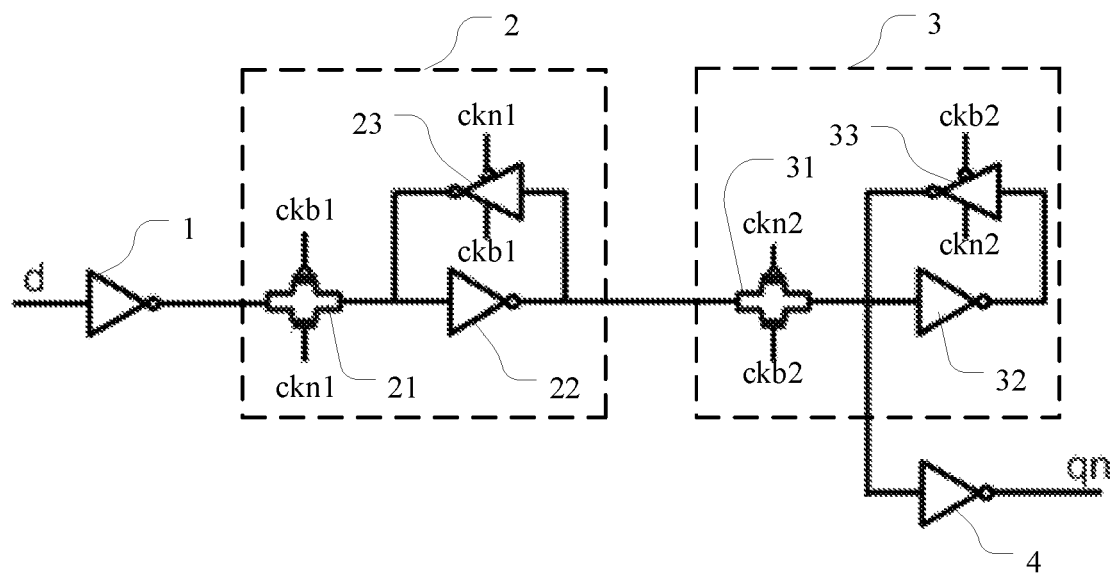
FIG. 1 illustrates a logic circuit of an exemplary flip-flop consistent with various embodiments of the present disclosure.

FIG. 1 illustrates a logic circuit of an exemplary flip-flop provided by an embodiment of the present disclosure.

In one embodiment, the flip-flop may include a first inverter 1, a second inverter 4, a master latch 2, and a slave latch 3.

In the first inverter 1, an input terminal may be configured to receive data signals, and an output terminal may be coupled to an input terminal of the master latch 2. The input terminal of the first inverter 1 may be an input terminal of the flip-flop.

In the mater latch 2, the input terminal may be coupled to the output terminal of the first inverter 1, to receive the inverted data signals output by the first inverter 1. An output terminal of the master latch 2 may be coupled to an input terminal of the slave latch 3, to output the inverted data signal after latching to the slave latch 3.

The input terminal of the slave latch 3 may be coupled to the output terminal of the master latch 2, to receive the inverted data signal after latching from the mast latch 2. An output terminal of the slave latch 3 may be coupled to an input terminal of the second inverter 4, to output the inverted data signal after latching to the second inverter 4.

The input terminal of the second inverter 4 may be coupled to the output terminal of the slave latch 3, to receive the inverted data signal after latching from the slave latch 3. An output terminal of the second inverter 4 may be configured as an output terminal qn of the flip-flop. The second inverter 4 may invert the inverted data signal input to the second inverter 4 to achieve the data signal.

In one embodiment, the data signal input to the first inverter 1 may be generated in advance, and input to the first inverter 1 through the input terminal d of the first inverter 1. The master latch 2 and the slave latch 3 may be controlled using the first clock signal and the second clock signal respectively, such that the data signal may be transmitted to the input terminal of the second inverter 4 through the master latch 2 and the slave latch 3, and finally be output via the output terminal qn of the second inverter 4.

In one embodiment, both the master latch 2 and the slave latch 3 may include two clock signal input terminals, respectively, for inputting the first clock signal and the second clock signal. Specifically, the first clock signal input terminal of the master latch 2 may be configured for inputting the first clock signal, and the second clock signal input terminal of the master latch 2 may be configured for inputting the second clock signal. The first clock signal input terminal of the slave latch 3 may be configured for inputting the first clock signal, and the second clock signal input terminal of the slave latch 3 may be configured for inputting the second clock signal.

In the present disclosure, a duration of the first clock signal input to the first clock signal input terminal of the master latch 2 may be t1, and a duration of the first clock signal input to the first clock signal input terminal of the slave latch 3 may be t2. t1>t2, that is, the duration of the first clock signal input to the first clock signal input terminal of the slave latch 3 may be shorter and the duration of the first clock signal input to the first clock signal input terminal of the master latch 2 may be longer.

In the present disclosure, a duration of the second clock signal input to the second clock signal input terminal of the master latch 2 may be t3, and a duration of the second clock signal input to the second clock signal input terminal of the slave latch 3 may be t4. t3>t4, that is, the duration of the second clock signal input to the second clock signal input terminal of the slave latch 3 may be shorter and the duration of the second clock signal input to the second clock signal input terminal of the master latch 2 may be longer.

Correspondingly, an opening speed of the slave latch 3 may be faster than an opening speed of the master latch 2. Therefore, a settling time of the flip-flop may be reduced, and a circuit response speed of the flip-flop may be improved. Further, there may be no need to make additional adjustments to the circuit structure of the flip-flop.

In one embodiment, the master latch 2 may include a first transmission gate 21, a first tri-state gate 23, and a third inverter 22. The slave latch 3 may include a second transmission gate 31, a second tri-state gate 33, and a fourth inverter 32.

FIG. 1 illustrates the master latch 2 and the slave latch 3 in one embodiment of the present disclosure.

As illustrated in FIG. 1, in the master latch 2 and the slave latch 3, an input terminal of the first transmission gate 21 may be coupled to the output terminal of the first inverter 1. An output terminal of the first transmission gate 21 may be coupled to an input terminal of the third inverter 22 and an output terminal of the first tri-state gate 23. An input terminal of the first tri-state gate 23 may be coupled to an output terminal of the third inverter 22, and an output terminal of the first tri-state gate 23 may be coupled to the input terminal of the third inverter 22 and the output terminal of the first transmission gate 21. An input terminal of the third inverter 22 may be coupled to the output terminal of the first transmission gate 21 and the output terminal of the first tri-state gate 23, and the output terminal of the third inverter 22 may be coupled to the input of the first tri-state gate 23.

The input terminal of the first transmission gate 21 may be configured as the input terminal of the main latch 2, and the output terminal of the third inverter 22 may be configured as the output terminal of the main latch 2.

An input terminal of the second transmission gate 31 may be coupled to the output terminal of the main latch 2. An output terminal of the second transmission gate 31 may be coupled to an input terminal of the fourth inverter 32, an output terminal of the second tri-state gate 33, and an input terminal of the second inverter 4. An input terminal of the second tri-state gate 33 may be coupled to an output terminal of the fourth inverter 32. The output terminal of the second tri-state gate 33 may be coupled to the output terminal of the second transmission gate 31, the input terminal of the fourth inverter 32, and the input terminal of the second inverter 4. The input terminal of the fourth inverter 32 may be coupled to the output terminal of the second transmission gate 31 and the output terminal of the second tri-state gate 33. The output terminal of the fourth inverter 32 may be coupled to the output terminal of the second tri-state gate 33. The input is coupled. The input terminal of the second transmission gate 31 may be configured as the input terminal of the slave latch 3, and the output terminal of the second tri-state gate 33 may be configured as the output terminal of the slave latch 3.

In one embodiment, the first transmission gate 21 and the first tri-state gate 23 of the master latch 2 may be both controlled by the clock signal. The first transmission gate 21 may include two clock signal input terminals. One of the two clock signal input terminals of the first transmission gate 21 may be configured for inputting the first clock signal ckn1, and another one of the two clock signal input terminals of the first transmission gate 21 may be configured for inputting the second clock signal ckn2. The first tri-state gate 23 may include two clock signal input terminals. One of the two clock signal input terminals of the first tri-state gate 23 may be configured for inputting the first clock signal ckn1, and another one of the two clock signal input terminals of the tri-state gate 23 may be configured for inputting the second clock signal ckn2.

In one embodiment, the first clock signal input terminal of the master latch 2 may include one of the two clock signal input terminals of the first transmission gate 21 for inputting the first clock signal ckn1 and one of the two clock signal input terminals of the first tri-state gate 23 for inputting the first clock signal ckn1. The second clock signal input terminal of the master latch 2 may include another one of the two clock signal input terminals of the first transmission gate 21 for inputting the second clock signal ckn2 and another one of the two clock signal input terminals of the tri-state gate 23 for inputting the second clock signal ckn2.

In one embodiment, the second transmission gate 31 and the second tri-state gate 33 of the slave latch 3 may be both controlled by the clock signal. The second transmission gate 21 may include two clock signal input terminals. One of the two clock signal input terminals of the second transmission gate 31 may be configured for inputting the first clock signal ckn1, and another one of the two clock signal input terminals of the second transmission gate 31 may be configured for inputting the second clock signal ckn2. The second tri-state gate 33 may include two clock signal input terminals. One of the two clock signal input terminals of the second tri-state gate 33 may be configured for inputting the first clock signal ckn1, and another one of the two clock signal input terminals of the tri-state gate 23 may be configured for inputting the second clock signal ckn2.

In one embodiment, the first clock signal input terminal of the slave latch 3 may include one of the two clock signal input terminals of the second transmission gate 31 for inputting the first clock signal ckn1 and one of the two clock signal input terminals of the second tri-state gate 33 for inputting the first clock signal ckn1. The second clock signal input terminal of the slave latch 3 may include another one of the two clock signal input terminals of the second transmission gate 31 for inputting the second clock signal ckn2 and another one of the two clock signal input terminals of the tri-state gate 23 for inputting the second clock signal ckn2.

Figure 1A:
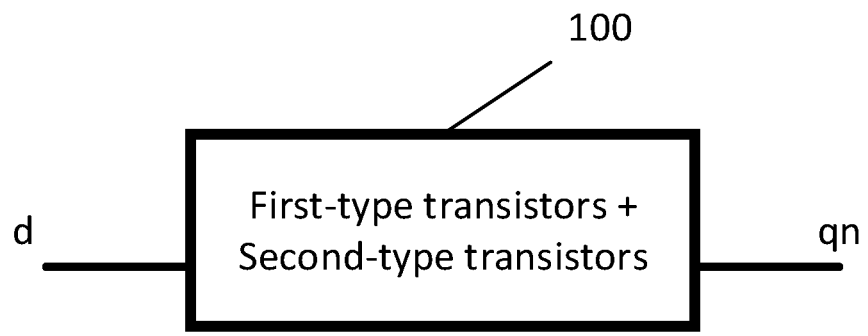
FIG. 1A illustrates a diagram of an exemplary flip-flop consistent with various embodiments of the present disclosure.

In one embodiment, a portion of the devices in a data transmission path of the flip-flop 100 may be composed of first-type transistors and another portion of the devices in the data transmission path of the flip-flop may be composed of second-type transistors as shown in FIG. 1A. In some other embodiments, all of the devices in the data transmission path of the flip-flop may be composed of the first-type transistors, and other devices forming the flip-flop may be composed of the second-type transistors.

Differences between the first-type transistors and the second-type transistors may include that a channel length of the first-type transistors may be smaller than a channel length of the second-type transistors. That is, the first-type transistors may be short-channel transistors, and the second-type transistors may be long-channel transistors.

In one embodiment, the channel length of the first-type transistors may be about 14 nm to about 19 nm, and the channel length of the second-type transistors may be about 20 nm to about 25 nm. The values of the channel length of the first-type transistors and the channel length of the second-type transistors in the previous embodiments are used as an example to illustrate the present disclosure for description purposes only, and should not limit the scopes of the present disclosure. In various embodiments, the channel length of the first-type transistors and the channel length of the second-type transistors may be any suitable values according to the actual application needs.

In one embodiment, the devices in the data transmission path of the flip-flop may include the first inverter 1, the first transmission gate 21, the third inverter 22, the second transmission gate 31, and the second inverter 4.

A portion of the devices of the master latch 2 and a portion of the devices of the slave latch 3 may be located in the data transmission path of the flip-flop.

Figure 1B:
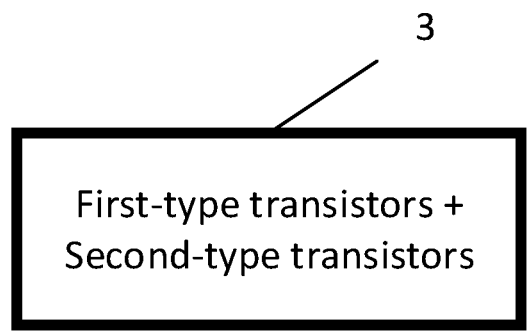
FIG. 1B illustrates a diagram of an exemplary slave latch consistent with various embodiments of the present disclosure.

In one embodiment, as shown in FIG. 1B, the portion of the devices of the slave latch 3 in the data transmission path of the flip-flop may be composed of the first-type transistors. Other devices of the slave latch 3 may be composed of the first-type transistors, the second-type transistors, or a mixture of the first-type transistors and the second-type transistors.

In one embodiment, the portion of the devices of the slave latch 3 in the data transmission path of the flip-flop may be the second transmission gate 31. Correspondingly, the second transmission gate 31 may be composed of the first-type transistors. In the slave latch 3, the second tri-state gate 33 and the fourth inverter 32 may be not located in the data transmission path of the flip-flop. Correspondingly, the second tri-state gate 33 of the slave latch 3 may be composed of the first-type transistors, the second-type transistors, or a mixture of the first-type transistors and the second-type transistors. The fourth inverter 32 of the slave latch 3 may be composed of the first-type transistors, the second-type transistors, or a mixture of the first-type transistors and the second-type transistors.

In one embodiment, for the master latch 2, any one of the first transmission gate 21, the first tri-state gate 23, and the first inverter 1, may be composed of the first-type transistors, the second-type transistors, or a mixture of the first-type transistors and the second-type transistors.

In various embodiments, a type of the transistors in each device of the master latch 2 may be determined according to the actual application needs. A type of the transistors in the fourth inverter 32 and the second tri-state gate 33 of the slave latch 3 may be determined according to the actual application needs.

Figure 1C:
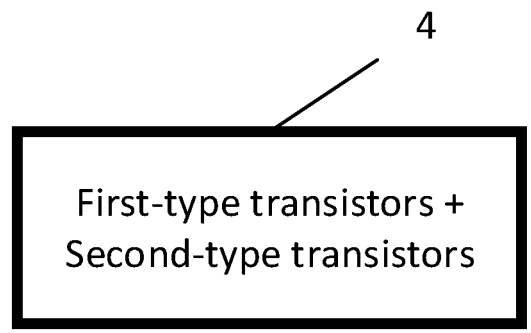
FIG. 1C illustrates a diagram of a second inverter consistent with various embodiments of the present disclosure.

In one embodiment, the devices closest to the output terminal of the flip-flop may be composed of the first-type transistors. As illustrated in FIG. 1, the devices closest to the output terminal of the flip-flop may include the second inverter 4. Correspondingly, the second inverter 4 may be composed of the first-type transistors as shown in FIG. 1C.

In existing technologies, a unit circuit may generally use short-channel transistors or generally use long-channel transistors as a whole. For the unit circuit composed of the short-channel transistors as a whole, a circuit transmission rate may be improved and the circuit power consumption may be reduced at the expense of increased leakage. For the unit circuit composed of the long-channel transistors as a whole, a leakage current may be effectively reduced.

In the present disclosure, the flip-flop may be considered as a unit circuit. By mixing the long-channel transistors and the short-channel transistors in the flip-flop, the characteristics of the long-channel transistors and the short-channel transistors may be used effectively, to balance the circuit transmission rate, power consumption, and leakage.

Figure 2:
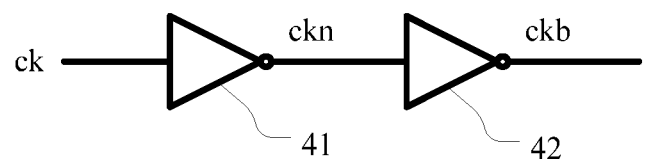
FIG. 2 illustrates a structure of an exemplary clock signal generation circuit consistent with various embodiments of the present disclosure.

In one embodiment, the flip-flop may further include a clock signal generation circuit. FIG. 2 illustrates a structure of a clock signal generation circuit consistent with various embodiments of the present disclosure.

The clock signal generation circuit may include a fifth inverter 41 and a sixth inverter 42. Original clock signal ck may be input to an input terminal of the fifth inverter 41, and an output terminal of the fifth inverter 41 may be coupled to an input terminal of the sixth inverter 42 to output the first clock signal ckn. The input terminal of the sixth inverter 42 may be coupled to the output terminal of the fifth inverter 41, and an output terminal of the sixth inverter 42 may output the second clock signal ckb.

As illustrated in FIG. 2, the first clock signal may be an inverted signal of the original clock signal and the second clock signal may be an inverted signal of the first clock signal.

Figure 2A:
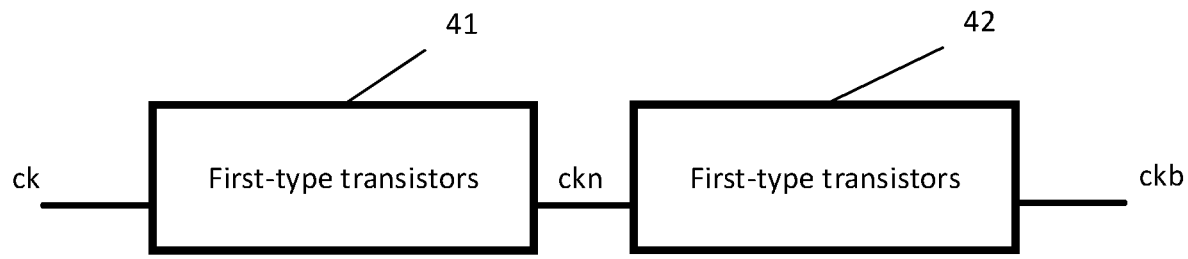
FIG. 2A illustrates a diagram of an exemplary fifth inverter and an exemplary sixth inverter consistent with various embodiments of the present disclosure.

In one embodiment, when designing a diagram of the flip-flop, a length of a connecting wire between the first clock signal input terminal of the slave latch 3 and the output terminal of the fifth inverter may be shorter than a length of a connecting wire between the first clock signal input terminal of the master latch 2 and the output terminal of the fifth inverter. Further, a length of a connecting wire between the second clock signal input terminal of the slave latch 3 and the output terminal of the sixth inverter may be shorter than a length of a connecting wire between the second clock signal input terminal of the master latch 2 and the output terminal of the sixth inverter. As shown in FIG. 2A, each of the fifth inverter 41 and the sixth inverter 42 may include the first-type transistors.

By using connecting wires with different lengths, a duration of a first clock signal input to a first clock signal input terminal of a master latch may be configured to be greater than a duration of a first clock signal input to a first clock signal input terminal of a slave latch. A duration of a second clock signal input to a second clock signal input terminal of the master latch may be configured to be greater than a duration of a second clock signal input to a second clock signal input terminal of a slave latch.

Figure 3:
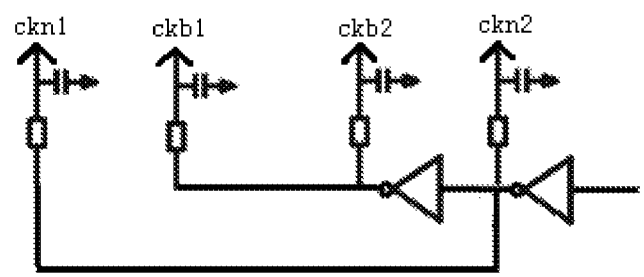
FIG. 3 illustrates an exemplary lumped parameter circuit model of an exemplary flip-flop consistent with various embodiments of the present disclosure.

FIG. 3 illustrates a lumped parameter circuit model of an exemplary consistent with various embodiments of the present disclosure. As illustrated in FIG. 3, a length of the connecting wires which the first clock signal cnk2 passes through to be input to the slave latch may be shorter than a length of the connecting wires which the first clock signal cnk1 passes to be input to the master latch. A length of the connecting wires which the second clock signal cnb2 passes to be input to the slave latch may be shorter than a length of the connecting wires which the second clock signal cnb1 passes to be input to the master latch.

In one embodiment, the first clock signal ckn2 and the first clock signal ckn1 may both be the clock signal ckn output by the fifth inverter 41. The first clock signal ckn2 and the first clock signal ckn1 may be transmitted through different connecting wires to be input to the first clock signal input terminal of the slave latch 3 and the first clock signal input terminal of the master latch 2.

The second clock signal ckb2 and the second clock signal ckb1 may both be the clock signal ckb output by the sixth inverter 42. The second clock signal ckb2 and the second clock signal ckb1 may be transmitted through different connecting wires to be input to the second clock signal input terminal of the slave latch 3 and the second clock signal input terminal of the master latch 2.

In the present disclosure, a duration of a first clock signal input to a first clock signal input terminal of a master latch may be greater than a duration of a first clock signal input to a first clock signal input terminal of a slave latch. A duration of a second clock signal input to a second clock signal input terminal of the master latch may be greater than a duration of a second clock signal input to a second clock signal input terminal of a slave latch. Therefore, when clock signal input is received, an opening speed of the slave latch may be faster than an opening speed of the master latch. A settling time of the flip-flop may be reduced and a circuit response speed of the flip-flop may be improved, without the need for additional adjustments on the circuit structure. Optimization of the flip-flop may be simplified.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A flip-flop, comprising a first inverter, a second inverter, a master latch, and a slave latch, wherein:
   the first inverter includes an input terminal configured to receive data signal, and an output terminal coupled to an input terminal of the master latch;
   an output terminal of the master latch is coupled to an input terminal of the slave latch;
   an output terminal of the slave latch is coupled to an input terminal of the second inverter;
   each of the master latch and the slave latch includes two clock signal input terminals for inputting first clock signal and second clock signal respectively;
   an output terminal of the second inverter is configured as an output terminal of the flip-flop;
   a time delay duration of the first clock signal inputted to the first clock signal input terminal of the master latch is greater than a time delay duration of the first clock signal inputted to the first clock signal input terminal of the slave latch;

a time delay duration of the second clock signal inputted to the second clock signal input terminal of the master latch is greater than a time delay duration of the second clock signal inputted to the second clock signal input terminal of the slave latch;

a portion of devices in a data transmission path of the flip-flop includes first-type transistors;

a remaining portion of the devices in the data transmission path of the flip-flop includes second-type transistors; and a channel length in the first-type transistors is less than a channel length in the second-type transistors.

2. The flip-flop according to claim 1, wherein:

a portion of devices of the slave latch in the data transmission path of the flip-flop includes the first-type transistors; and a remaining portion of the devices of the slave latch includes the first-type transistors or the second-type transistors.

3. The flip-flop according to claim 2, wherein:

the slave latch includes a second transmission gate, a second tri-state gate, and a fourth inverter;

the second transmission gate includes an input terminal coupled to the output terminal of the master latch, and an output terminal coupled to an input terminal of the fourth inverter, an output terminal of the second tri-state gate, and the input terminal of the second inverter;

the second transmission gate is disposed in the data transmission path of the flip-flop; and an output terminal of the fourth inverter is coupled to an input terminal of the second tri-state gate.

4. The flip-flop according to claim 1, wherein devices closest to the output terminal of the flip-flop include the first-type transistors.

5. The flip-flop according to claim 4, wherein the second inverter includes the first-type transistors.

6. The flip-flop according to claim 1, further including a clock signal generation circuit, wherein:

the clock signal generation circuit includes a fifth inverter and a sixth inverter;

the fifth inverter includes an input terminal configured to input original clock signal, and an output terminal coupled to an input terminal of the sixth inverter, for outputting the first clock signal; and the sixth inverter includes the input terminal configured to input the first clock signal, and an output terminal configured to output the second clock signal.

7. The flip-flop according to claim 6, wherein:

each of the fifth inverter and the sixth inverter includes the first-type transistors.

8. The flip-flop according to claim 6, wherein:

a length of a connecting wire between the first clock signal input terminal of the slave latch and the output terminal of the fifth inverter is smaller than a length of a connecting wire between the first clock signal input terminal of the master latch and the output terminal of the fifth inverter; and a length of a connecting wire between the second clock signal input terminal of the slave latch and the output terminal of the sixth inverter is smaller than a length of a connecting wire between the second clock signal input terminal of the master latch and the output terminal of the sixth inverter.

9. The flip-flop according to claim 6, wherein:

the first clock signal is an inverted signal of the original clock signal and the second clock signal is an inverted signal of the first clock signal.

10. The flip-flop according to claim 1, wherein:

the channel length in the first-type transistor is about 14 nm to about 19 nm, and the channel length in the second-type transistors is about 20 nm to about 25 nm.

* * * * *